(12) United States Patent
Evans et al.

(10) Patent No.: US 9,068,086 B2
(45) Date of Patent: *Jun. 30, 2015

(54) COMPOSITIONS FOR ANTIREFLECTIVE COATINGS

(71) Applicants: Dow Global Technologies LLC, Midland, MI (US); Rohm and Haas Electronic Materials LLC, Marlborough, MA (US)

(72) Inventors: Jessica P. Evans, Freeport, TX (US); Christopher P. Sullivan, Lakeville, MA (US)

(73) Assignees: Dow Global Technologies LLC, Midland, MI (US); Rohm and Haas Electronic Materials LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/705,677

(22) Filed: Dec. 5, 2012

(65) Prior Publication Data

US 2013/0164545 A1    Jun. 27, 2013

Related U.S. Application Data

(60) Provisional application No. 61/578,282, filed on Dec. 21, 2011.

(51) Int. Cl.

| C08G 77/08 | (2006.01) |
| C09D 5/00 | (2006.01) |
| B05D 5/06 | (2006.01) |
| C09D 4/00 | (2006.01) |
| C08G 77/04 | (2006.01) |
| C08G 77/16 | (2006.01) |
| C08G 77/18 | (2006.01) |
| C08G 77/24 | (2006.01) |
| G03F 7/075 | (2006.01) |
| G03F 7/09 | (2006.01) |

(Continued)

(52) U.S. Cl.
CPC .............. *C09D 5/006* (2013.01); *C09D 183/08* (2013.01); *B05D 5/06* (2013.01); *C09D 4/00* (2013.01); *C08G 77/04* (2013.01); *C08G 77/16* (2013.01); *C08G 77/18* (2013.01); *C08G 77/24* (2013.01); *G03F 7/0752* (2013.01); *G03F 7/091* (2013.01); *C09D 183/06* (2013.01); *C08G 77/12* (2013.01); *C08G 77/14* (2013.01); *C08G 77/20* (2013.01); *C08L 83/06* (2013.01)

(58) Field of Classification Search
CPC ..... C09D 5/006; C09D 183/06; C09D 183/08
USPC .................................................... 106/287.11
See application file for complete search history.

(56) References Cited

U.S. PATENT DOCUMENTS 5,100,503 A    3/1992    Allman et al.

5,621,034 A    4/1997    Mautner (Continued)

FOREIGN PATENT DOCUMENTS

| KR | 2009084748 | 8/2009 |
| KR | 2010058591 | 6/2010 |
| WO | 2010/087233 | * 8/2010 |

*Primary Examiner* — Margaret Moore

(57) ABSTRACT

A composition comprising the following:
A) a cure catalyst selected from Formula A:

[NR1'R2'R3'R4']⁺X⁻    (Formula A),

R1', R2', R3', R4' are each independently selected from hydrogen, alkyl, substituted alkyl, aryl, or substituted aryl;
X is a monovalent anion, and
wherein at least one of R1', R2', R3' or R4' is a methyl; and
B) a prepolymer formed from a first composition comprising:

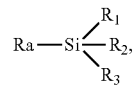

Ra comprises one or more multiple bonds, provided that, if Ra comprises more than one multiple bond, these multiple bonds are not in a conjugated configuration; R1, R2, R3 are described herein;

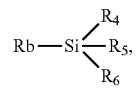

Rb is selected from H or a saturated group comprising alkyl, alkylene, or alkylidene; R4, R5, R6 are described herein;

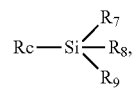

Rc comprises more than one multiple bond, and these multiple bonds are in a conjugated configuration; R7, R8, R9 are described herein; and

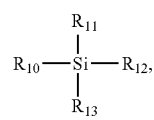

R10, R11, R12, R13 described herein.

19 Claims, No Drawings

(51) Int. Cl.
    *C09D 183/06*     (2006.01)
    *C08L 83/06*     (2006.01)
    *C09D 183/08*     (2006.01)
    *C08G 77/12*     (2006.01)
    *C08G 77/14*     (2006.01)
    *C08G 77/20*     (2006.01)

(56) References Cited

U.S. PATENT DOCUMENTS

| | | |
|---|---|---|
| 6,268,457 B1 | 7/2001 | Kennedy et al. |
| 7,303,785 B2 | 12/2007 | Ogihara et al. |
| 7,417,104 B2 | 8/2008 | Iwabuchi et al. |
| 7,507,783 B2 | 3/2009 | Meador et al. |
| 7,736,837 B2 | 6/2010 | Abdallah et al. |
| 8,026,038 B2 | 9/2011 | Ogihara et al. |
| 8,029,974 B2 | 10/2011 | Ogihara et al. |
| 8,318,258 B2 | 11/2012 | Shirahata |
| 2001/0032568 A1* | 10/2001 | Schutt .................... 106/287.11 |
| 2005/0031964 A1 | 2/2005 | Babich et al. |
| 2005/0277058 A1 | 12/2005 | Iwabuchi et al. |
| 2006/0278158 A1 | 12/2006 | Tolbert et al. |
| 2007/0185298 A1 | 8/2007 | Baikerikar et al. |
| 2008/0116170 A1 | 5/2008 | Collins et al. |
| 2008/0196626 A1* | 8/2008 | Wu et al. .................. 106/287.34 |
| 2008/0274432 A1 | 11/2008 | Ogihara et al. |
| 2009/0011372 A1 | 1/2009 | Ogihara et al. |
| 2009/0148789 A1 | 6/2009 | Amara et al. |
| 2009/0274974 A1 | 11/2009 | Abdallah et al. |
| 2010/0086870 A1 | 4/2010 | Ogihara et al. |
| 2010/0086872 A1 | 4/2010 | Ogihara et al. |
| 2010/0147334 A1 | 6/2010 | Ogihara et al. |
| 2010/0210765 A1 | 8/2010 | Nakajima et al. |
| 2010/0261097 A1 | 10/2010 | Sun |
| 2011/0045404 A1 | 2/2011 | Imamura et al. |
| 2011/0117746 A1 | 5/2011 | Maruyama et al. |
| 2012/0129352 A1* | 5/2012 | Mori et al. ................ 438/703 |
| 2013/0071560 A1 | 3/2013 | Rao et al. |

* cited by examiner

COMPOSITIONS FOR ANTIREFLECTIVE COATINGS

REFERENCE TO RELATED APPLICATIONS

The present application claims the benefit of U.S. Provisional Application No. 61/578,282, filed Dec. 21, 2011.

BACKGROUND

The present invention relates to compositions, and in particular, to bottom antireflective coating compositions (or "BARCs"), for use in microelectronic applications. In the microelectronic industry there is a continual need for microchips that have smaller and more defined lithography patterns. Problems facing these developments today include deterioration of the developed photoresist profile, due to the reflection at the interface of the photoresist layer and the substrate, and the need for a thin resist layer to accommodate shorter exposure wavelengths, and which has sufficient etch resistance. Antireflective coatings can be used to address the above problems.

The cure catalyst plays a vital role in properties of the final antireflective coating, such as photospeed and pattern collapse margin. However, stability and litho performance of silsesquioxane prepolymer solutions using conventional cure catalysts have been undesirable. There is a need for improved cure catalysts for use in improved SiARC formulations, and which provide improved stability and improved litho performance.

U.S. Publication No. 2008/274432 discloses a "silicon-containing film" formed from a heat curable composition comprising the following: (A-1) a silicon-containing compound, obtained through hydrolytic condensation of a hydrolyzable silicon compound, in the presence of an acid catalyst, (A-2) a silicon-containing compound, obtained through hydrolytic condensation of a hydrolyzable silicon compound, in the presence of a base catalyst, (B) a hydroxide or organic acid salt of Li, Na, K, Rb or Ce, or a sulfonium, iodonium or ammonium compound, (C) an organic acid, (D) a cyclic ether-substituted alcohol, and (E) an organic solvent.

U.S. Publication No. 2010/0210765 discloses a resist underlayer film-forming composition comprising the following: a polymer having silicon atoms in the backbone; a compound of a polycyclic structure; and an organic solvent. The compound of the polycyclic structure has at least two carboxyl groups as substituents, and the two carboxyl groups are individually bonded to two carbon atoms, adjacent to each other, to form the polycyclic structure. The two carboxyl groups both have an endo configuration or an exo configuration, or a cis configuration.

U.S. Pat. No. 8,029,974 discloses a thermosetting "metal oxide-containing film-forming composition" for forming a "metal oxide-containing film to be formed in a multilayer resist process. The thermosetting "metal oxide-containing film-forming composition" comprises at least: (A) a "metal oxide-containing compound," obtained by hydrolytic condensation of a hydrolyzable silicon compound and a hydrolyzable metal compound, (B) a thermal crosslinking accelerator, (C) a monovalent, divalent or higher, organic acid having 1 to 30 carbon atoms, (D) a trivalent, or higher, alcohol, and (E) an organic solvent.

International Publication No. WO 2009/133456 discloses an absorption graded, silicon-based antireflective coating and a method to form the same. The method comprises the steps of coating a substrate with an antireflective coating composition, comprising a transparent siloxane, and a light absorbing dye, and heating the coated substrate at a temperature, where a portion of the dye sublimes out of said composition to form a non-uniform, absorption graded, anti-reflective coating layer.

U.S. Pat. No. 8,026,038 discloses a "metal oxide-containing film," formed from a heat curable composition comprising the following: (A) a metal oxide-containing compound, obtained through hydrolytic condensation of a hydrolyzable silicon compound and a hydrolyzable metal compound, (B) a hydroxide or organic acid salt of Li, Na, K, Rb or Cs, or a sulfonium, iodonium or ammonium compound, (C) an organic acid, and (D) an organic solvent.

European Application No. EP2172807A1 discloses a thermosetting composition for forming a silicon-containing film in a multilayer resist process, and containing at least (A) a "silicon-containing compound," obtained by hydrolyzing and condensing a hydrolyzable silicon compound using an acid as a catalyst, (B) a thermal crosslinking accelerator, (C) a monovalent, or bivalent or more, organic acid having 1 to 30 carbon atoms, (D) trivalent, or more alcohol, and (E) an organic solvent.

U.S. Publication No. 2011/0117746 discloses a coating composition comprising an organopolysiloxane, a solvent, and a quaternary ammonium salt or a quaternary phosphonium salt; or a coating composition comprising a polysilane, a solvent, and at least one additive selected from a group consisting of a crosslinking agent, a quaternary ammonium salt, a quaternary phosphonium salt, and a sulfonic acid compound. The polysilane has, at a terminal thereof, a silanol group or a silanol group together with a hydrogen atom.

U.S. Publication No. 2008/0196626 discloses a composition comprising the following: (a) a polymer having at least one repeating unit of formula —[(SiO$_{n/2}$)(R$^1$)$_{4-n}$]—, where R$^1$ is a non-hydrolysable group, and n is an integer ranging from 1 to 3; and (b) a crosslinking catalyst. The composition is disclosed as useful in forming low k dielectric constant materials, as well as hard mask and underlayer materials with anti-reflective properties.

U.S. Publication No. 2009/0011372 discloses a silicon-containing film, formed from a heat curable composition comprising the following: (A) a silicon-containing compound, obtained through hydrolytic condensation of a hydrolyzable silicon compound in the presence of an acid catalyst; (B) a hydroxide or organic acid salt of Li, Na, K, Rb or Ce, or a sulfonium, iodonium or ammonium compound; (C) an organic acid; (D) a cyclic ether-substituted alcohol; and (E) an organic solvent.

Additional compositions for antireflective films and/or other electronic applications are disclosed in the following references: U.S. Pat. Nos. 7,507,783, 7,303,785, 7,736,837, 5,100,503, 5,621,034, 7,417,104, 6,268,457; U.S. Publication Nos. 2005/0031964, 2009/0148789, 2009/0148789; 2007/0185298, 2010/0086872, 2010/0261097, 2005/0277058, 2006/0278158, 2011/0045404; International Publication Nos. WO2009/088600, 2008/061258; European Application No. EP2196858A1; and KR2009084748A (Abstract), KR2010058591A (Abstract). However, there remains a need for compositions for improved antireflective layer compositions which have increased stability and improved BARC performance. These needs and others have been met by the following invention.

SUMMARY OF INVENTION

The invention provides a composition comprising at least the following:

A) a cure catalyst selected from Formula A:

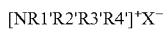  (Formula A),

R1', R2', R3', R4' are each independently selected from hydrogen, alkyl (linear or branched), substituted alkyl, aryl, or substituted aryl;

X is a monovalent anion, and wherein in Formula A, at least one of R1', R2', R3' or R4' is a methyl; and B) a prepolymer formed from a first composition comprising the following:

a) a Compound F1 selected from Formula 1:

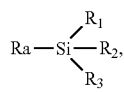  (Formula 1)

wherein Ra comprises one or more multiple bonds, provided that, if Ra comprises more than one multiple bond, these multiple bonds are not in a conjugated configuration; and R1, R2, and R3 are each independently selected from alkoxyl, hydroxyl, halide, OC(O)R, or OC(O)OR, wherein R is alkyl or a substituted alkyl;

b) a Compound F2 selected from Formula 2:

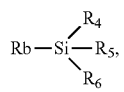  (Formula 2)

wherein Rb is selected from H or a saturated group comprising alkyl, alkylene, or alkylidene; and R4, R5, and R6 are each independently selected from alkoxyl, hydroxyl, halide, OC(O)R, or OC(O)OR, wherein R is alkyl or a substituted alkyl;

c) a Compound F3 selected from Formula 3:

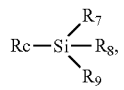  (Formula 3)

wherein Rc comprises more than one multiple bond, and these multiple bonds are in a conjugated configuration; and R7, R8, and R9 are each independently selected from alkoxyl, hydroxyl, halide, OC(O)R, or OC(O)OR, wherein R is alkyl or a substituted alkyl; and d) a Compound F4 selected from Formula 4:

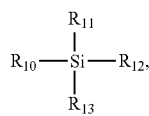  (Formula 4)

wherein R10, R11, R12, and R13 are each independently selected from alkoxyl, hydroxyl, halide, OC(O)R, or OC(O)OR, wherein R is alkyl or a substituted alkyl.

DETAILED DESCRIPTION

As discussed above, the invention provides a composition comprising at least the following:

A) a cure catalyst selected from Formula A:

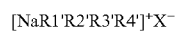  (Formula A),

R1', R2', R3', R4' are each independently selected from hydrogen, alkyl (linear or branched), substituted alkyl, aryl, or substituted aryl;

X is a monovalent anion, and wherein in Formula A, at least one of R1', R2', R3' or R4' is a methyl; and B) a prepolymer formed from a first composition comprising the following:

a) a Compound F1 selected from Formula 1:

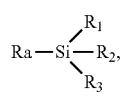  (Formula 1)

wherein Ra comprises one or more multiple bonds (that is, double bonds or triple bonds), including C=C, C≡C, C=O, C=N, and C≡N, provided that, if Ra comprises more than one multiple bond, these multiple bonds are not in a conjugated configuration; and R1, R2, and R3 are each independently selected from alkoxyl, hydroxyl, halide, OC(O)R, or OC(O)OR, wherein R is alkyl or a substituted alkyl;

b) a Compound F2 selected from Formula 2:

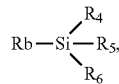  (Formula 2)

wherein Rb is selected from H or a saturated group comprising alkyl, alkylene, or alkylidene; and R4, R5, and R6 are each independently selected from alkoxyl, hydroxyl, halide, OC(O)R, or OC(O)OR, wherein R is alkyl or a substituted alkyl;

c) a Compound F3 selected from Formula 3:

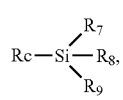  (Formula 3)

wherein Rc comprises more than one multiple bond, including C=C, C≡C, C=O, C=N, and C≡N, and these multiple bonds are in a conjugated configuration; and R7, R8, and R9 are each independently selected from alkoxyl, hydroxyl, halide, OC(O)R, or OC(O)OR, wherein R is alkyl or a substituted alkyl; and d) a Compound F4 selected from Formula 4:

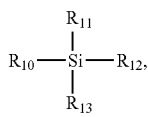

(Formula 4)

wherein R10, R11, R12, and R13 are each independently selected from alkoxyl, hydroxyl, halide, OC(O)R, or OC(O)OR, wherein R is alkyl or a substituted alkyl.

As used herein, R1 refers to $R_1$; R2 refers $R_2$; and so forth.

The inventive composition may comprise a combination of two or more embodiments as described herein.

In one embodiment, the first composition comprises less than 2 weight percent of a trivalent or higher multivalent alcohol, based on the weight of the prepolymer.

In one embodiment, the first composition comprises less than 1 weight percent of a trivalent or higher multivalent alcohol, based on the weight of the prepolymer.

In one embodiment, the first composition comprises less than 0.5 weight percent of a trivalent or higher multivalent alcohol, based on the weight of the prepolymer.

In one embodiment, the first composition comprises less than 0.1 weight percent of a trivalent or higher multivalent alcohol, based on the weight of the prepolymer.

In one embodiment, the first composition comprises less than 0.05 weight percent of a trivalent or higher multivalent alcohol, based on the weight of the prepolymer.

In one embodiment, the first composition comprises less than 0.01 weight percent of a trivalent or higher multivalent alcohol, based on the weight of the prepolymer.

In one embodiment, the first composition comprises less than 0.005 weight percent of a trivalent or higher multivalent alcohol, based on the weight of the prepolymer.

In one embodiment, the first composition does not comprises a trivalent or higher multivalent alcohol, based on the weight of the prepolymer.

Some trivalent and higher multivalent alcohols are described in, for example, U.S. Pat. No. 8,029,974 and EP 2172807A1.

In one embodiment, in Formula A, at least two of R1', R2', R3' or R4' are each a methyl.

In one embodiment, in Formula A, R1', R2', R3', R4' are each independently selected from hydrogen, C1-C3 alkyl or aryl.

In one embodiment, the composition comprises less than 1 ppm of a metal oxide, based on the weight of the composition.

In one embodiment, the composition does not comprise a metal oxide. Metal oxides tend to cause gelation, defects in film coating, poor chemical stability, and/or refractive indexes outside of the targeted range for antireflective coating applications. Some compositions including metal oxides have been described in, for example, U.S. Pat. No. 8,026,038B2.

In one embodiment, the composition comprises less than 1 ppm of a "light absorbing dye," based on the weight of the composition.

In one embodiment, the composition does not comprise a "light absorbing dye,"

"Light absorbing dyes" include, for example, bis-phenol compounds and derivatives of the same. See, for example, WO 2009/133456 for examples of "light absorbing dyes."

In one embodiment, the first composition comprises greater than, or equal to, 5 weight percent Si, or greater than, or equal to, 10 weight percent Si, or greater than, or equal to, 15 weight percent Si, based on the sum weight of Compounds F1, F2, F3 and F4.

In one embodiment, the sum molar amount of Compound F2 and Compound F4 is greater than, or equal to, 40 mole percent, based on the sum moles of Compounds F1, F2, F3 and F4.

In one embodiment, the sum molar amount of Compound F2 and Compound F4 is less than, or equal to, 85 mole percent, or less than, or equal to, 80 mole percent, based on the sum moles of Compounds F1, F2, F3 and F4.

In one embodiment, Compound F4 is present in an amount greater than 10 mole percent, based on the sum moles of Compounds F1, F2, F3 and F4.

In one embodiment, the molar ratio of F1/F4 is from 1/20 to 1/1, or from 1/15 to 1/1, or from 1/10 to 1/1.

In one embodiment, for the first composition, F1 ranges from 5 to 50 weight percent, or from 10 to 30 weight percent; F2 ranges from 5 to 50 weight percent, or from 10 to 40 weight percent; F3 ranges from 2 to 20 weight percent, or from 2 to 10 weight percent; F4 ranges from 20 to 80 weight percent, or from 30 to 80 weight percent. Each weight percentage is based on the weight of the first composition.

In one embodiment, for the first composition, Compound F1 is present in an amount from 10 to 90 mole percent, further from 15 to 90 mole percent, further from 20 to 90 mole percent, and further from 25 to 90 mole percent, based on the sum moles of Compounds F1, F2, F3 and F4.

In one embodiment, for the first composition, Compound F1 is present in an amount greater than 10 mole percent, further greater than 12 mole percent, based on the sum moles of Compounds F1, F2, F3 and F4.

In one embodiment, for the first composition, Compound F4 is present in an amount from 10 to 65 mole percent, further from 10 to 60 mole percent, further from 10 to 55 mole percent, and further from 10 to 50 mole percent, based on the sum moles of Compounds F1, F2, F3 and F4.

In one embodiment, for the first composition, Compound F4 is present in an amount less than 65 mole percent, further less than 60 mole percent, based on the sum moles of Compounds F1, F2, F3 and F4.

The first composition may comprise a combination of two or more embodiments as described herein.

In one embodiment, the prepolymer is formed by at least the following: hydrolyzing the first composition to form a hydrolyzed product, and condensing the hydrolyzed product.

In one embodiment, the prepolymer has an Mw from 1,000 to 20,000 g/mole, or from 1,000 to 10,000 g/mole, or from 1,000 to 5,000 g/mole, as determined by conventional GPC.

In one embodiment, the prepolymer has an Mw/Mn from 1.1 to 6, or from 1.2 to 5, or from 1.5 to 4.

The prepolymer may comprise a combination of two or more embodiments as described herein.

The invention also provides a crosslinked composition formed from a second composition.

The invention also provides an article comprising at least one component formed from an inventive composition.

In one embodiment, the article is a film.

The invention also provides a film comprising at least one layer formed from an inventive composition. In a further embodiment, the film comprises at least two layers. In a further embodiment, the second layer is formed from another composition comprising at least one polymer.

The invention also provides a film comprising at least two layers, and wherein at least one layer is an anti-reflective layer formed from an inventive composition. In a further embodiment, the other layer is a photoresist layer.

The invention also provides a film comprising at least two layers, and wherein at least one layer is an anti-reflective layer formed from an inventive composition. In a further embodiment, the other layer is a photoresist layer.

An inventive article may comprise a combination of two or more embodiments as described herein.

An inventive film may comprise a combination of two or more embodiments as described herein.

The invention also provides a method of forming a coating on a substrate, said method comprising at least the following: providing a substrate,
forming an underlayer on the substrate, wherein the underlayer comprises at least one polymer,
applying an inventive composition over the underlayer, and
curing the composition to form the coating. In a further embodiment, multiple layers of the composition are applied over the underlayer.

In one embodiment, the coating is an antireflective layer.

The invention also provides a method of forming a coating on a substrate, said method comprising at least the following: providing a substrate,
applying an inventive composition over at least a portion of the substrate, or over one or more intermediate layers applied over said substrate, and
curing the composition to form the coating. In a further embodiment, multiple layers of the composition are applied over at least a portion of the substrate, or over one or more intermediate layers applied over said substrate.

In one embodiment, the coating is an antireflective layer.

An inventive method may comprise a combination of two or more embodiments as described herein.

Cure Catalyst

The cure catalyst is selected from Formula A:

$$[NR1'R2'R3'R4']^+X^-$$ (Formula A),

R1', R2', R3', R4' are each independently selected from hydrogen, alkyl (linear or branched), substituted alkyl, aryl, or substituted aryl;

X is a monovalent anion, and preferably a halide selected from Br, Cl, I, or F, more preferably from Br, Cl, and more preferably Cl, and wherein in Formula A, at least one of R1', R2', R3' or R4' is a methyl. In a further embodiment, at least two of R1', R2', R3' or R4' are each a methyl.

In one embodiment, R1', R2', R3', R4' are each independently selected from alkyl (linear or branched), substituted alkyl, aryl, or substituted aryl.

In one embodiment, R1', R2', R3', R4' are each independently selected from hydrogen, alkyl (linear or branched), or aryl.

In one embodiment, R1', R2', R3', R4' are each independently selected from alkyl (linear or branched), or aryl.

In one embodiment, R1', R2', R3', R4' are each independently selected from a C1-C3 alkyl (linear or branched), or aryl. In a further embodiment, the aryl is a C5-C6 aryl.

In one embodiment, R1', R2', R3', R4' are each independently selected from a C1-C2 alkyl (linear or branched), or aryl. In a further embodiment, the aryl is a C5-C6 aryl.

In one embodiment, at least three of R1', R2', R3' or R4' are each a methyl.

In one embodiment, each of R1', R2', R3' or R4' is a methyl.

In one embodiment, the cure catalyst is selected from the group consisting of the following: benzyltrimethylammonium chloride, benzyldimethylhexadecylammonium chloride, phenyltrimethylammonium chloride, tetramethylammonium chloride, or combinations thereof.

A "substituted alkyl" refers to, an alkyl with one or more of the hydrogens substituted with another group comprising at least one heteroatom.

A "substituted aryl" refers to, an aryl with one or more of the hydrogens substituted with another group comprising at least one heteroatom.

The cure catalyst may comprise a combination of two or more embodiments as described herein.

Compounds F1-F4

Compounds F1, F2, F3 and F4 are described below.

A) A Compound F1 selected from Formula 1:

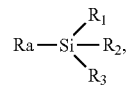

(Formula 1)

wherein Ra comprises one or more multiple bonds, including C=C, C≡C, C=O, C=N, and C≡N, provided that, if Ra comprises more than one multiple bond, these multiple bonds are not in a conjugated configuration; and R1, R2, and R3 are each independently selected from alkoxyl, hydroxyl, halide, OC(O)R, or OC(O)OR, wherein R is an alkyl or a substituted alkyl. In a further embodiment, R is alkyl.

In one embodiment, Ra comprises one or more of an alkenyl group, an alkynyl group, an imide, a nitrile, a ketone, an ester, an amide, or a carbonate, and it comprises from 2 to 10 carbon atoms; and R1, R2, and R3 are each independently selected from OH, OR, or OC(O)R, wherein R is a $C_1$-$C_{10}$ alkyl or a $C_1$-$C_{10}$ substituted alkyl.

In one embodiment, Ra comprises one or more of an alkenyl group, an alkynyl group, an imide, a nitrile, a ketone, an ester, an amide, or a carbonate, and it comprises from 2 to 10 carbon atoms; and R1, R2, and R3 are each independently selected from OH, OR, or OC(O)R, wherein R is a $C_1$-$C_{10}$ alkyl.

In one embodiment, Ra is selected from vinyl, allyl, propenyl, butenyl, acetoxyl, cyanoethyl, acetoethyl, or acetamidopropyl; and, R1, R2, and R3 are each OR, wherein each R independently is selected from methyl, ethyl, n-propyl, 2-propyl, n-butyl, isobutyl, or 2-butyl.

In one embodiment, Compound F1 is selected from vinyltrimethoxysilane or vinyltriethoxysilane

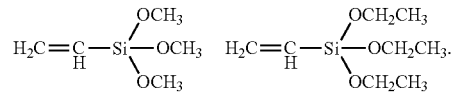

B) A Compound F2 selected from Formula 2:

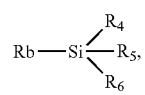

(Formula 2)

wherein Rb is selected from H or a saturated group comprising alkyl, alkylene, or alkylidene; and R4, R5, and R6 are each independently selected from alkoxyl, hydroxyl, halide, OC(O)R, or OC(O)OR, wherein R is an alkyl or a substituted alkyl. In a further embodiment, R is an alkyl.

In one embodiment, Rb is selected from a saturated group comprising alkyl, alkylene, or alkylidene; and, R4, R5, and R6 are each independently selected from alkoxyl, hydroxyl, halide, OC(O)R, or OC(O)OR, wherein R is an alkyl or a substituted alkyl. In a further embodiment, R is an alkyl.

In one embodiment, Rb is a saturated group comprising substituted or unsubstituted $C_1$-$C_{10}$ cyclic alkyl, a substituted or unsubstituted $C_1$-$C_{10}$ acyclic alkyl, a substituted or unsubstituted $C_1$-$C_{10}$ cyclic alkylene, a substituted or unsubstituted $C_1$-$C_{10}$ acyclic alkylene, a substituted or unsubstituted $C_1$-$C_{10}$ cyclic alkylidene, a substituted or unsubstituted $C_1$-$C_{10}$ acyclic alkylidene, or H; or an unsubstituted $C_1$-$C_{10}$ cyclic alkyl, an unsubstituted $C_1$-$C_{10}$ acyclic alkyl, an unsubstituted $C_1$-$C_{10}$ cyclic alkylene, an unsubstituted $C_1$-$C_{10}$ acyclic alkylene, an unsubstituted $C_1$-$C_{10}$ cyclic alkylidene, an unsubstituted $C_1$-$C_{10}$ acyclic alkylidene, or H; or an unsubstituted $C_1$-$C_{10}$ cyclic alkyl, an unsubstituted $C_1$-$C_{10}$ acyclic alkyl, or H; or an unsubstituted $C_1$-$C_{10}$ cyclic alkyl, or an unsubstituted $C_1$-$C_{10}$ acyclic alkyl; or an unsubstituted $C_1$-$C_{10}$ acyclic alkyl; and R4, R5, and R6 are each independently selected from OH, OR, or OC(O)R, wherein R is a $C_1$-$C_{10}$ alkyl or a $C_1$-$C_{10}$ substituted alkyl. In a further embodiment, R is a $C_1$-$C_{10}$ alkyl.

In one embodiment, Rb is selected from methyl, ethyl, n-propyl, 2-propyl, n-butyl, isobutyl, or 2-butyl; and R4, R5, and R6 are each OR, wherein each R independently is selected from methyl, ethyl, n-propyl, 2-propyl, n-butyl, isobutyl, or 2-butyl.

In one embodiment, Compound F2 is selected from methyltrimethoxysilane or methyltriethoxysilane.

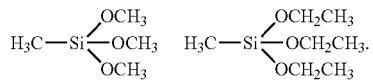

C) a Compound F3 selected from Formula 3:

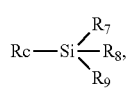
(Formula 3)

wherein Rc comprises more than one multiple bond, including C=C, C≡C, C=O, C=N, and C≡N, and these multiple bonds are in a conjugated configuration; and R7, R8, and R9 are each independently selected from alkoxyl, hydroxyl, halide, OC(O)R, or OC(O)OR, wherein R is an alkyl or a substituted alkyl. In a further embodiment, R is an alkyl.

In one embodiment, Rc comprises an aryl or substituted aryl, a conjugated diene or conjugated triene, a conjugated diketone, a conjugated keto-ester, an α,β-unsaturated ester, an α,β-unsaturated ketone, a nitrile in conjugation with an alkene, a nitrile in conjugation with an ketone, a nitrile in conjugation with an ester, an alkyne in conjugation with an alkene, an alkyne in conjugation with an ketone, or an alkyne in conjugation with an ester; and R7, R8, and R9 are each independently selected from OH, OR, or OC(O)R, wherein R is a $C_1$-$C_{10}$ alkyl or a $C_1$-$C_{10}$ substituted alkyl. In a further embodiment, R is a $C_1$-$C_{10}$ alkyl.

In one embodiment, Rc comprises a phenyl group, a naphthyl group, an anthracene group, a phenanthrene group, a fluorene group, a pyridine group, a quinoline group, an imidazole group, a benzoimidazole group, an indole group, a carbazole group, a furan group, a benzofuran group, a dibenzofuran group, an acryloxyl group, an acrylamido group, a methacryloxyl group, or a methacrylamido group; and R7, R8, and R9 are each OR, wherein each R independently is selected from methyl, ethyl, n-propyl, 2-propyl, n-butyl, isobutyl, or 2-butyl.

In one embodiment, Compound F3 is selected from phenyltrimethoxysilane or phenyltriethoxysilane.

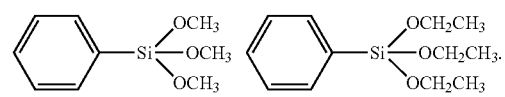

D) A Compound F4 selected from Formula 4:

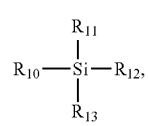
(Formula 4)

wherein R10, R11, R12, and R13 are each independently selected from alkoxyl, hydroxyl, halide, OC(O)R, or OC(O)OR, wherein R is an alkyl or a substituted alkyl. In a further embodiment, R is an alkyl.

In one embodiment, R10, R11, R12, and R13 are each independently selected from OH, OR, or OC(O)R, wherein R is a $C_1$-$C_{10}$ alkyl or a $C_1$-$C_{10}$ substituted alkyl. In a further embodiment, R is a $C_1$-$C_{10}$ alkyl.

In one embodiment, R10, R11, R12, and R13 are OR, wherein each R independently is selected from methyl, ethyl, n-propyl, 2-propyl, n-butyl, isobutyl, or 2-butyl.

In one embodiment, Compound F4 is selected from tetramethyl orthosilicate or tetraethyl orthosilicate:

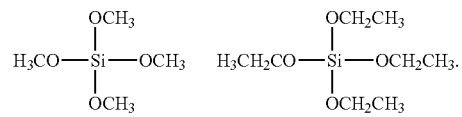

A "substituted alkyl" refers to, an alkyl with one or more of the hydrogens substituted with another group comprising at least one heteroatom.

A "substituted aryl" refers to, an aryl with one or more of the hydrogens substituted with another group comprising at least one heteroatom.

Tri-Layer Coatings

Tri-layer coatings, for example, tri-layer resists, typically comprise: (a) a curable underlayer composition on a substrate; (b) a hardmask composition (for example, a hardmask layer formed from an inventive composition described herein) applied above the curable composition; and (c) a photoresist composition layer applied above the hard mask composition. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g.

waveguides) also can be employed. Coating compositions and lithographic processes are described in U.S. Publication 2007/0238052 and U.S. Publication 2009/0148789, each incorporated herein by reference.

A variety of photoresists may be used in combination (i.e., overcoated) with an inventive coating composition of the present invention. Preferred photoresists include chemically-amplified resists, especially positive-acting or negative-acting photoresists that contain one or more photoacid generator compounds, and a resin component that contains units that undergo a deblocking or cleavage reaction in the presence of photogenerated acid, such as photoacid-labile ester, acetal, ketal or ether units.

Negative-acting photoresists also can be employed with coating compositions of the invention, such as resists that crosslink (i.e., cure or harden) upon exposure to activating radiation. Preferred photoresists for use with a coating composition of the invention may be imaged with relatively short-wavelength radiation, for example, radiation having a wavelength of less than 300 nm, or less than 260 nm, such as about 248 nm, or radiation having a wavelength of less than about 200 nm, such as 193 nm Suitable photoresists contain an imaging-effective amount of photoacid generator compounds and one or more resins. Suitable resins, include, but are not limited to, i) phenolic resin that contains acid-labile groups (for example, see U.S. Pat. Nos. 6,042,997 and 5,492,793); ii) polymers that contain polymerized units of a vinylphenol, an optionally substituted vinylphenyl (e.g., styrene) that does not contain a hydroxyl or carboxyl ring substituent, and an alkyl acrylate such as those deblocking groups described with polymers i) above, such as polymers described in U.S. Pat. No. 6,042,997; and iii) polymers that contain repeat units that comprise an acetal or ketal moiety that will react with photoacid, and optionally aromatic repeat units, such as phenyl or phenolic groups; such polymers have been described in U.S. Pat. Nos. 5,929,176 and 6,090,526.

Additional resins include resins that are substantially, or completely, free of phenyl or other aromatic groups, and that can provide a chemically amplified resist particularly suitable for imaging at sub-200 nm wavelengths such as 193 nm. Preferred resins of this class include the following: i) polymers that contain polymerized units of a non-aromatic cyclic olefin (endocyclic double bond), such as an optionally-substituted norbornene, such as polymers described in U.S. Pat. Nos. 5,843,624, and 6,048,664; ii) polymers that contain alkyl acrylate units, such as, for example, t-butyl acrylate, t-butyl methacrylate, methyladamantyl acrylate, methyladamantyl methacrylate, and other acyclic alkyl and alicyclic acrylates; such polymers have been described in U.S. Pat. No. 6,057,083; European Published Applications EP01008913A1 and EP00930542A1, and iii) polymers that contain polymerized anhydride units, particularly polymerized maleic anhydride and/or itaconic anhydride units, such as disclosed in European Published Application EP01008913A1 and U.S. Pat. No. 6,048,662.

Other resins include resins that contain repeat units that contain a heteroatom, particularly oxygen and/or sulfur (but other than an anhydride, i.e. the unit does not contain a carbonyl ring atom), and preferably is substantially or completely free of any aromatic units. Preferably, the heteroalicyclic unit is fused to the resin backbone, and further preferred is where the resin comprises a fused carbon alicyclic unit, such as provided by polymerization of a norborene group and/or an anhydride unit, such as provided by polymerization of a maleic anhydride or itaconic anhydride. Also, resins that contain fluorine substitution (fluoropolymer), for example, as may be provided by polymerization of tetrafluoroethylene, a fluorinated aromatic group, such as fluorostyrene compound, and the like.

DEFINITIONS

The term "composition," as used herein, includes a mixture of materials which comprise the composition, as well as reaction products and decomposition products formed from the materials of the composition.

The term "polymer," as used herein, refers to a polymeric compound prepared by polymerizing monomers, whether of the same or a different type. The generic term polymer thus embraces the term homopolymer (employed to refer to polymers prepared from only one type of monomer, with the understanding that trace amounts of impurities can be incorporated into the polymer structure), and the term interpolymer as defined hereinafter.

The term "interpolymer," as used herein, refers to polymers prepared by the polymerization of at least two different types of monomers. The generic term interpolymer includes copolymers (employed to refer to polymers prepared from two different monomers), and polymers prepared from more than two different types of monomers.

The term "prepolymer," as used herein, refers to a polymer of molecular weight Mw (weight average), for example, from about 500 g/mole to 100,000 g/mole, preferably from 500 to 50,000 g/mole (as determined by conventional GPC, as described below).

The term "multiple bond" as used herein may refer to either a double bond or a triple bond.

The term "conjugated configuration" as used herein, refers to a configuration of multiple bonds that occurs in a compound, in which two multiple bonds are separated by one single bond, forming an alternating pattern (for example, "double bond-single bond-double bond" or "triple bond-single bond-double bond" or "double bond-single bond-triple bond"). In a conjugated configuration the multiple bonds may independently be double bonds or triple bonds. More than one alternating pattern may be present in a compound with a conjugated configuration of bonds. Examples of compounds with conjugated bonds are benzene, 1,4-butadiene, furan, acrylonitrile, and acrylic acid.

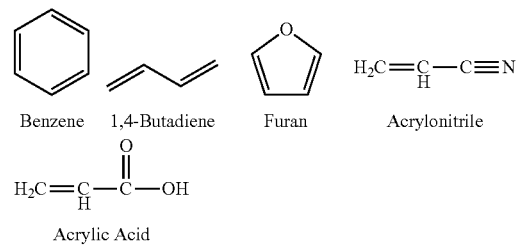

Benzene    1,4-Butadiene    Furan    Acrylonitrile

Acrylic Acid

The terms "comprising," "including," "having," and their derivatives, are not intended to exclude the presence of any additional component, step or procedure, whether or not the same is specifically disclosed. In order to avoid any doubt, all compositions claimed through use of the term "comprising" may include any additional additive, adjuvant, or compound, whether polymeric or otherwise, unless stated to the contrary. In contrast, the term, "consisting essentially of" excludes from the scope of any succeeding recitation any other component, step, or procedure, excepting those that are not essential to operability. The term "consisting of" excludes any component, step, or procedure not specifically delineated or listed.

Test Methods

Measurement of Molecular Weight by GPC (Conventional)

Molecular weight of the prepolymer was monitored by Gel Permeation Chromatography (GPC), also referred to as Size Exclusion Chromatography (SEC). The instrument was equipped with a set of columns appropriate for measuring molecular weights in the range of about 500 g/mole to at least about 100,000 g/mole, based on polystyrene calibration standards. Particularly effective was a set of two "SHODEX LF-804 GPC columns," 8 mm diameter×300 mm length, available from Thomson Instrument Co., installed in series. The mobile phase was tetrahydrofuran, and it was pumped at a rate of 1 mL/min. The instrument was also equipped with a refractive index detector. Calibration was done using polystyrene standards, available from Polymer Standards Service GmbH, Mainz, Germany. The Mn, Mw, and MWD were calculated using the "GPC-addon" for ChemStation software, available from Agilent Technologies, Inc.

Single Layer Coating

Each prepolymer was spin coated onto a silicon wafer, for analysis, to obtain a single layer thin film coating. In a cleanroom environment (about 72° F., about 50% RH, class 100), unprimed "200 mm" diameter silicon wafers from WaferNet Inc., were used as substrates. Onto a Si wafer, the composition was hand dispensed, and spin coated on a Tokyo Electron "TEL ACT-8 Coat Track" to a nominal film thickness of 35 nm (as measured on a THERMA-WAVE spectroscopic ellipsometer). The coated wafer was baked at the specified temperature for 60 seconds (see Table 2) to afford the Formulation ID listed in Table 2. Then the wafers were subjected to evaluation by water contact angle, strip tests, and refractive index measurement.

Measurement of Water Contact Angle

Single layer coatings, as discussed above, were analyzed within one hour of coating. A DATAPHYSICS Instruments GmbH, model OCA20 goniometer was used for all contact angle measurements. Deionized water was used as the test liquid. A one microliter drop was used for each contact angle determination. After the drop was dispensed on the surface of the single layer coating, the drop motion was recorded for a minimum of ten seconds for each measurement, using the goniometer camera, at a minimum rate of three frames/second. The first drop image, when the goniometer needle had been completely removed from the field of view, and no drop motion was present, was used to determine the contact angle. The contact angle was evaluated using a circular model in the OCA software. A minimum of three separate measurements were made across a single layer coating (three drops per single layer coating). Typical standard deviations for contact angle measurements are about 0.2 degrees.

The film quality is critical in order to obtain a good pattern during the photolithography process. The inventive layer is likely to be used in a multilayer scheme, where there will be another layer coated on top of the inventive layer. If the surface energy of the inventive layer is too low, as indicated by high water contact angle, defects such as dewets, which arise when the film does not fully cover the coated area, can appear in a film layer above the inventive layer. In order to minimize the surface defects of the adjacent layers, the water contact angle of an inventive layer is preferably less than 87°.

Measurement of Strip Values

After spin coating to form single layers, films were examined for solvent resistance by solvent strip tests using a TEL ACT8 track. Prepared wafers were exposed to PGMEA for a "90 sec puddle," followed by a soft bake at 110° C. for 60 seconds. Thickness changes were measured on a Thermawave Optiprobe. Positive values were noted as film thickness loss. The same sample was then exposed to a MF26A developer (tetramethylammonium hydroxide solution, TMAH) for a "60 sec puddle," followed by a soft bake at 110° C. for 60 seconds, and the thickness differences were measured again using a Thermawave Optiprobe. For the developer strip test, positive values indicated film thickness was gained. Minimized strip values are desirable to indicate resistance to strip or swelling.

Measurement of Refractive Index

There are two refractive indexes mentioned in the experimental section: $n_{193}$ and $n_{633}$ $n_{193}$ The optical properties and thickness of the films were measured using a WOOLAM VUV-VASE VU-302 ellipsometer (Woolam, Neb.). Films were coated on "200 mm" diameter bare silicon wafers, as described above in the single layer coating method. Polarization data was collected at three angles over a range of wavelengths from 170 nm to 900 nm. The data was automatically generated to obtain the thickness of the film and the refractive index (n, k) at 193 nm, where n is the real part of the complex refractive index and k is the imaginary part of the complex refractive index.

$n_{633}$

For faster screening, some samples were only analyzed by coating, strip tests, contact angle, and refractive index at 633 nm After spin coating, as described in the single layer method, the wafer was subjected to the strip tests using the TEL ACT8 track. The wafers were then subjected to contact angle measurements. Finally, the refractive index was determined by the Thermawave Optiprobe at 633 nm wavelength.

EXPERIMENTAL

Materials

Materials used in this invention were obtained from commercial sources and used as received. The abbreviation and source of raw materials are as follows:

V=VTMS: Vinyltrimethoxysilane (Sigma Aldrich, Dow Corning),

M=MTMS: Methyltrimethoxysilane (Sigma Aldrich, Dow Corning),

Ph=PTMS: Phenyltrimethoxysilane (Sigma Aldrich, Dow Corning),

TEOS: Tetraethyl orthosilicate (Sigma Aldrich, Dow Corning),

PGMEA: Propylene glycol monomethyl ether acetate (DOWANOL PMA, The Dow Chemical Company), BTEAC: Benzyltriethylammonium chloride (Sigma Aldrich), BTMAC: Benzyltrimethylammonium chloride (Sigma Aldrich), BTBAC: Benzyltributylammonium chloride (Sigma Aldrich), BTEABr: Benzyltriethylammonium bromide (Sigma Aldrich), BDMHDAC: Benzyldimethylhexadecylammonium chloride (Sigma Aldrich), PhTMAC: Phenyltrimethylammonium chloride (Sigma Aldrich), TMAC: Tetramethylammonium chloride (Sigma Aldrich), AC: Ammonium chloride, $NH_4^+Cl^-$ (Sigma Aldrich), GuanHCl: Guanidinium hydrochloride (Sigma Aldrich), and THMP: Trishydroxymethyl propane (Sigma Aldrich), The "3N aqueous acetic acid solution" was prepared in the lab. Glacial acetic acid was supplied by JT Baker.

The "0.1N aqueous hydrochloric acid" was prepared in the lab. Concentrated hydrochloric acid was supplied by Fisher.

Cure catalyst structures are shown below.

BTEAC:

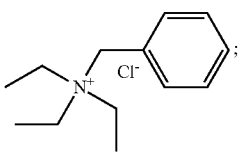

BTMAC:

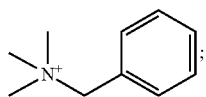

BTBAC:

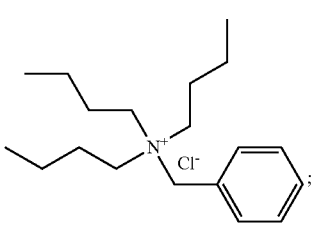

BTEABr:

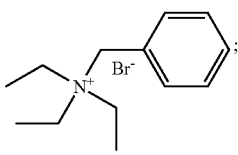

BDMHDAC:

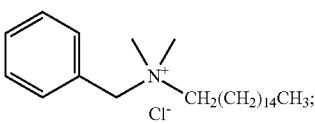

PhTMAC:

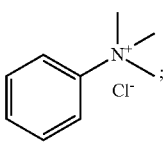

TMAC:

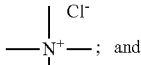

and

GuanHCl:

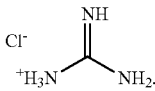

The prepolymers were synthesized by typical sol gel procedure, in which silane monomers are first hydrolyzed with water and acid, and then condensed into a prepolymer network. The synthesis section details the synthesis of each of the prepolymer batches which were used for testing. The composition of each of the prepolymers are shown in Table 1. The formulation and spin coating section details how the prepolymers were diluted for single layer coatings onto the wafers. The final section details the evaluation of the wafers prepared from the coating and annealing. Table 2 shows the formulation ID, and Table 3 presents the evaluation of those formulations after coating.

Synthesis of Inventive and Comparative Prepolymers

Prepolymer 1

A three neck, 500 mL flask was equipped with a temperature probe, an overhead stirrer with a 2 inch TEFLON paddle, and a syringe pump addition adapter. The flask was first charged with acetic acid (3N, 24.31 g). The silane monomers (PTMS 8.95 g, VTMS 11.11 g, MTMS 24.49 g, TEOS 41.60 g) and the first aliquot of PGMEA (65 g) were weighed into a NALGENE bottle, and transferred to the reaction flask by a syringe pump, at room temperature, over one hour. The syringe adapter was then replaced with a dean stark trap and condenser under a nitrogen flow. The reaction mixture was heated by an oil bath (set point 100.0° C.) for the distillate collection. After 45 minutes, another aliquot of PGMEA (50 g) was added, and the temperature was ramped to 125° C. with continuation of distillate collection. After one hour, the dean stark trap was removed, and the reaction was cooled. At this point, a GPC aliquot was removed, to afford Mw 3018 g/mol. The flask was reheated with an oil bath at 125° C., until the target molecular weight was obtained. Once the polymer solution reached a molecular weight close to target (5000 g/mol), the solution was diluted with a third charge of PGMEA (20 g), and cooled to room temperature. Samples were prepared for analysis by diluting the solution to 5% solids with PGMEA. (23.01% solids concentrate, 5925 g/mol weight average molecular weight by PS standards).

Prepolymer 2

A 3-neck, 250-mL flask was equipped with a temperature probe, a constant RPM overhead stirrer with a two inch TEFLON paddle, and a syringe pump addition adapter. Distilled silane monomers phenyltrimethoxysilane (7.03 g, 35.4 mmol), methyltrimethoxysilane (38.12 g, 279.8 mmol), and tetraethyl orthosilicate (16.42 g, 78.8 mmol) were weighed into a plastic bottle, transferred to the reaction flask, and diluted with 65.5 mL of PGMEA. Hydrochloric acid (0.1N, 3.95 mL, 3.95 mmol) was diluted with HPLC-grade water (19.49 mL, 1082 mmol), mixed in a graduated cylinder, and then added dropwise, over 30 minutes, to the silane solution, by a syringe pump, at ambient room temperature. Upon completion of the "acid/water solution addition step," the syringe pump addition adapter was replaced with a short path distillation head, fitted with a nitrogen line, after which, the solution was then heated by an oil bath with a set point of 100° C. Reaction aliquots (0.2 mL) were removed frequently, and diluted in THF (1.0 mL) to be analyzed by GPC. The polymer solution reached a molecular weight close to target (5000 g/mole) after heating for 75 minutes. The solution was diluted to 21.9 wt % solids, based on the total weight of the solution, with additional PGMEA (46.8 mL, 342 mmol), and cooled to room temperature. The solution was agitated over an excess equivalence of DOWEX MARATHON MR-3 mixed ion exchange resin, produced by Dow Chemical Co., and then filtered through a "0.2 µm" PTFE syringe filter. The molecular weight was measured by GPC: Mw 4079 g/mole; Mn 1798 g/mole; MWD 2.27.

Prepolymer 3

A three neck, 500 mL flask was equipped with a temperature probe, an overhead stirrer with a 2 inch TEFLON paddle, and a syringe pump addition adapter. The flask was first charged with acetic acid (3N, 73.30 mL). The silane monomers (PTMS 18.85 g, VTMS 23.49 g, MTMS 37.42 g, TEOS 110.05 g) and the first aliquot of PGMEA (175 mL) were weighed into a NALGENE bottle, and transferred to the reaction flask by a syringe pump, at room temperature, over one hour. The syringe adapter was then replaced with a dean stark trap and condenser under a nitrogen flow while the reaction continued to stir for 15 minutes at ambient temperature. The reaction mixture was heated by an oil bath (set point 100.0° C.) for the distillate collection for 3 hours. After 3 hours, the temperature was ramped to 110° C. with continuation of distillate collection. Once the distillation stopped, the polymer solution the solution was diluted with a second charge of PGMEA (125 mL), and cooled to room temperature. Samples were prepared for analysis by diluting the solution to 5% solids with PGMEA. (20.19% solids concentrate, 3474 g/mol weight average molecular weight by PS standards).

Prepolymer 4

A 3-neck, 250-mL flask was equipped with a temperature probe, a constant RPM overhead stirrer with a two inch TEFLON paddle, and a syringe pump addition adapter. Distilled silane monomers phenyltrimethoxysilane (7.77 g, 39.0 mmol), vinyltrimethoxysilane (9.69 g, 65.1 mmol), and tetraethyl orthosilicate (68.68 g, 329.7 mmol) were weighed into a plastic bottle, transferred to the reaction flask, and diluted with 70.0 mL of PGMEA. Hydrochloric acid (0.1N, 2.17 mL) was diluted with HPLC-grade water (23.63 mL), mixed in a graduated cylinder, and then added dropwise, over 30 minutes, to the silane solution, by a syringe pump, at ambient room temperature. Upon completion of the "acid/water solution addition step," the syringe pump addition adapter was replaced with a short path distillation head, fitted with a nitrogen line, and stirred for 45 minutes, at ambient temperature. The solution was then heated by an oil bath with a set point of 100° C. Reaction aliquots (0.2 mL) were removed frequently, and diluted in THF (1.0 mL) to be analyzed by GPC. The polymer solution reached a molecular weight close to target (5000 g/mole) after heating for 3.5 hr. The solution was diluted to "21.8 wt % solids," based on the total weight of the solution, with additional PGMEA (50.0 mL), and cooled to room temperature. The solution was agitated over an excess equivalence of DOWEX MARATHON MR-3 mixed ion exchange resin, produced by The Dow Chemical Company, and then filtered through a "0.2 μm" PTFE syringe filter. The molecular weight was measured by GPC: Mw 3701 g/mole; Mn 1442 g/mole; MWD 2.57.

Prepolymer 5

A three neck, 500 mL flask was equipped with a dean stark trap and condenser, an overhead stirrer with a 2 inch TEFLON paddle, and a syringe pump addition adapter. The flask was first charged with distilled silane monomers (PTMS 16.34 g, VTMS 20.36 g, MTMS 32.43 g, TEOS 95.38 g) and the first aliquot of PGMEA (151.67 g). Glacial acetic acid (11.55 g) and HPLC grade water (51.98 g) were weighed into a NALGENE bottle, and transferred to the reaction flask, dropwise, by a syringe pump, at ambient temperature, over 30 minutes. The reaction mixture was stirred at ambient temperature for an additional 60 minutes. The syringe adapter was then replaced with a temperature probe, and the reaction mixture was heated by an oil bath (set point 100.0° C.) for the distillate collection. Distillate was collected, until a pot temperature of about 90° C. was reached. The solution was then diluted with PGMEA (108.38 g), and cooled to room temperature. The solution was filtered through a "0.2 μm" PTFE syringe filter. The molecular weight was measured by GPC: Mw 3333 g/mole; Mn 1580 g/mole; MWD 2.11 [19.0 wt % solids concentrate].

Prepolymer 6

A three neck, 500 mL flask was equipped with a temperature probe, an overhead stirrer with a 2 inch TEFLON paddle and a syringe pump addition adapter. The flask was first charged with distilled silane monomers (PTMS 16.34 g, VTMS 20.36 g, MTMS 32.44 g, TEOS 95.39 g) and the first aliquot of PGMEA (151.69 g). Glacial acetic acid (11.55 g) and HPLC grade water (51.98 g) were weighed into a NALGENE bottle, and transferred to the reaction flask, dropwise, by a syringe pump, at ambient temperature, over 30 minutes. The reaction mixture was stirred at ambient temperature for an additional 60 minutes. The syringe adapter was then replaced with a dean stark trap and condenser, and the reaction mixture was heated by an oil bath (set point 100.0° C.) for the distillate collection. Distillate was collected, until a pot temperature of about 90° C. was reached. The solution was then diluted with PGMEA (108.33 g) and cooled to room temperature. The solution was filtered through a "0.2 μm" PTFE syringe filter. The molecular weight was measured by GPC: Mw 2864 g/mole; Mn 1417 g/mole; MWD 2.02 [18.6 wt % solids concentrate].

Compositions

Formation of the First Composition—Prepolymer Solutions

Table 1 lists different first compositions of prepolymers that were used in this invention. Amounts are in mole percent, based on the total number of moles added to prepare the composition. The corresponding syntheses are discussed in the "Synthesis of Inventive and Comparative Prepolymers" section.

TABLE 1

Description of the Prepolymer Molar Composition (First Composition)

| Prepolymer ID | VTMS (F-1) | MTMS (F-2) | PTMS (F-3) | TEOS (F-4) |
|---|---|---|---|---|
| Prepolymer 1 | 15 | 36 | 9 | 40 |
| Prepolymer 2 | 0 | 71 | 9 | 20 |
| Prepolymer 3 | 15 | 26 | 9 | 50 |
| Prepolymer 4 | 15 | 0 | 9 | 76 |
| Prepolymer 5 | 15 | 26 | 9 | 50 |
| Prepolymer 6 | 15 | 26 | 9 | 50 |
| Prepolymer 7 | 15 | 26 | 9 | 50 |
| Prepolymer 8 | 15 | 26 | 9 | 50 |

Formulation and Spin Coating

Before spin coating, the prepolymer solution was diluted from the concentrated solution to make a 2 wt % solution with PGMEA, and 1 wt % malonic acid and 0.1 wt % cure catalyst were added (based on solids), unless otherwise noted. The cure catalysts were prepared as equimolar solutions (0.004M) for better comparison amongst samples for the first set (Formulations 1-9). The other comparatives were formulated with either 0.02 wt % cure catalyst or 0.1 wt % cure catalyst relative to the polymer (see Table 2). The formulations were filtered through a "0.2 micron" PTFE filter to form the SiARC Formulation ID.

For Formulations 1-9, prepolymer 1 (5 wt % assay in PGMEA, 5.934 g, 98.9% of the "2 wt % solids"), malonic acid (1.0 wt % assay in PGMEA, 0.30 g, 1% of the "2 wt % solids"), and cure catalyst (0.1 wt % assay in ethyl lactate, 0.3 g, 0.1% of the "2 wt % solids") was diluted in PGMEA (8.466 g).

For Formulation 10, prepolymer 2 (5 wt % assay in PGMEA, 5.939 g, 98.98% of the "2 wt % solids"), malonic acid (1.0 wt % assay in PGMEA, 0.30 g, 1% of the "2 wt % solids"), and cure catalyst (0.1 wt % assay in ethyl lactate, 0.060 g, 0.02% of the "2 wt % solids") was diluted in PGMEA (8.701 g).

For Formulation 11-14, the corresponding prepolymers (5 wt % assay in PGMEA, 5.934 g, 98.9% of the "2 wt % solids"), malonic acid (1.0 wt % assay in PGMEA, 0.30 g, 1% of the "2 wt % solids"), and cure catalyst (0.1 wt % assay in ethyl lactate, 0.3 g, 0.1% of the "2 wt % solids") was diluted in PGMEA (8.466 g).

For Formulations 15-18, the corresponding prepolymer (5 wt % assay in PGMEA, 5.936 g, 92.9% of the "2 wt % solids"), malonic acid (1 wt % assay in PGMEA, 2.237 g, 7% of the "2 wt % solids"), and cure catalyst (0.1 wt % assay in ethyl lactate, 0.320 g, 0.1% of the "2 wt % solids") was diluted in PGMEA (4.625 g), ethyl lactate (0.415 g), and oleyl alcohol (1.468 g).

Table 2 summarizes all of the formulations used in this study. For better comparison, see the different sections of data. It is ideal to compare Formulations 1-9 in a set, Formula 10, Formulas 11-13 as a set, Formulation 14, and Formulations 15-18 because each set was annealed under different conditions or formulated differently (specified in the headers in Tables 2 and 3).

TABLE 2

Description of the Formulation (Inventive Composition)

| Formulation ID | Prepolymer ID | Cure Catalyst | Additive |
|---|---|---|---|
| 240° C. 60 s (0.004 M cure catalyst) 1% MA | | | |
| Formulation 1 | 1 | BTEAC | |
| Formulation 2 | 1 | BTMAC | |
| Formulation 3 | 1 | BTBAC | |
| Formulation 4 | 1 | BTEABr | |
| Formulation 5 | 1 | BDMHDAC | |
| Formulation 6 | 1 | PhTMAC | |
| Formulation 7 | 1 | TMAC | |
| Formulation 8 | 1 | GuanHCl | |
| Formulation 9 | 1 | AC | |
| 225° C. 60 s (0.1 wt %) 1% MA | | | |
| Formulation 10 | 2 | BTEAC | |
| 240° C. 60 s (0.1 wt %) 1% MA | | | |
| Formulation 11 | 3 | BTEAC | THMP |
| Formulation 12 | 3 | none | THMP |
| Formulation 13 | 3 | BTEAC | |
| 240° C. 60 s (0.1 wt %) 1% MA | | | |
| Formulation 14 | 4 | BTEAC | |
| 240° C. 60 s (0.1 wt %) 7% MA | | | |
| Formulation 15 | 5 | TMAC | |
| Formulation 16 | 6 | TMAC | |
| Formulation 17 | 7 | TMAC | |
| Formulation 18 | 8 | TMAC | |

Film Property Characterization

The SiARC thin films were formed by spin coating on "200 mm" HQ silicon substrate, and subsequently cured on a hotplate at the reported temperature (° C.) for 60 seconds. All wafers were processed on a TEL ACT8 Coat Track.

After the formulations were blended, according to Table 2, the filtered solutions were spin coated onto silicon wafers, and subjected to strip tests, contact angle, and infrared measurements.

TABLE 3

Experimental Data from Film Property Characterization

| Formulation ID | Solvent Strip (%) | Developer Strip (%) | Contact Angle (°) | Refractive Index (633 nm) | Refractive Index (193 nm) |
|---|---|---|---|---|---|
| 240° C. 60 s (0.004 M cure catalyst) 1% MA | | | | | |
| Formulation 1 Comp. | 0.1 | 1.5 | 83 | 1.431 | |
| Formulation 2 Inv. | 0.3 | 1.1 | 83 | 1.428 | |
| Formulation 3 Comp. | 0.2 | 1.5 | 81 | 1.431 | |
| Formulation 4 Comp. | 0.1 | 1.6 | 81 | 1.432 | |
| Formulation 5 Inv. | 0.0 | 1.4 | 82 | 1.430 | |
| Formulation 6 Inv. | 0.1 | 1.3 | 81 | 1.434 | |
| Formulation 7 Inv. | 0.0 | 0.6 | 85 | 1.427 | |
| Formulation 8 Comp. | 0.3 | 1.2 | 78 | 1.440 | |
| Formulation 9 Comp. | 0.2 | 6.2 | 72 | 1.441 | |
| 225° C. 60 s (0.02 wt %) 1% MA | | | | | |
| Formulation 10 Comp. | 0.0 | 0.7 | 90 | | 1.655 |
| 240° C. 60 s (0.1 wt %) 1% MA | | | | | |
| Formulation 11 Comp. | 0.0 | 0.9 | 77 | 1.441 | |
| Formulation 12 Comp. | 0.0 | 1.3 | 63 | 1.449 | |
| Formulation 13 Comp. | 0.0 | 0.5 | 77 | 1.441 | |
| 240° C. 60 s (0.1 wt %) 1% MA | | | | | |
| Formulation 14 Comp. | 0.3 | 0.8 | 68 | | 1.680 |
| 240° C. 60 s (0.1 wt %) 7% MA | | | | | |
| Formulation 15 Inv. | 0.0 | 1.0 | 79 | | 1.675 |
| Formulation 16 Inv. | 0.0 | 1.0 | 80 | | 1.682 |
| Formulation 17 Inv. | 0.3 | 0.6 | 80 | | 1.674 |
| Formulation 18 Inv. | 0.2 | 0.9 | 78 | | 1.680 |

Summary

The screening suggested that a more dense film showed an increased contact angle, decreased refractive index, and lower strip values, each as a result of improved crosslinking. As seen in Table 3, the inventive formulations in which at least one R group of the curing agent is a methyl (Formulation 2, 5, 6, 7) had better solvent resistance and developer strip compared to the comparative examples (Formulation 1, 3, 4, 8, 9). Comparative formulations did not show optimized strip performance, which indicates a lower degree of cure. It is hypothesized that the inventive formulations provide a higher degree of cure, and thus a lower amount of free silanols remain in the film. Also, the contact angle (CA) should change as a function of curing. As silanols (lower CA) condense to form siloxane bonds (higher CA), the contact angle increases to form a more hydrophobic surface. Table 3 shows the inventive formulations have increased contact angle compared to the comparative formulations. However, contact angle can also be too high to cause surface defects and poor coating. The preferred contact angle ranges are preferably less than 87°. The inventive formulations form materials with low strip values, decreased refractive index values, and water contact angles within the required range.

When the formulation contained a multivalent alcohol, THMP, the strip increased compared to the control composition, contact angle decreased, which indicated a lower degree of cure in the film. (see Table 3, Formulations 11-13). One skilled in the art would expect a similar trend for the other cure catalysts disclosed herein, since the alcohol did not enhance performance.

In addition, as seen in Formulations 10 and 14, which contain only three silane monomers, the properties were not improved. For Formulation 10, which lacked the VTMS monomer, and had a large increase in the MTMS, the film lacked the refractive index required for electronic applications, and the contact angle exceeded the preferred limit, as discussed above, which would lead to poor coating performance. Formulation 14, which lacked MTMS, and had a large increase in TEOS, showed reasonable contact angle values, strip values, and met the refractive index requirements; however, surface defects were present in the film.

The invention claimed is:

1. A composition comprising at least the following:

A) a cure catalyst selected from Formula A:

[NR1'R2'R3'R4']⁺X⁻  (Formula A),

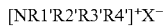

R1', R2', R3', R4' are each independently selected from hydrogen, alkyl (linear or branched), substituted alkyl, aryl, or substituted aryl;

X is a monovalent anion, and wherein in Formula A, at least one of R1', R2', R3' or R4' is a methyl; and B) a prepolymer formed from a first composition comprising the following:

a) a Compound F1 selected from Formula 1:

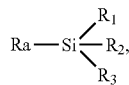

(Formula 1)

wherein Ra comprises one or more multiple bonds, provided that, if Ra comprises more than one multiple bond, these multiple bonds are not in a conjugated configuration; and R1, R2, and R3 are each independently selected from alkoxyl, hydroxyl, halide, OC(O)R, or OC(O)OR, wherein R is alkyl or a substituted alkyl;

b) a Compound F2 selected from Formula 2:

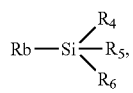

(Formula 2)

wherein Rb is selected from H or a saturated group comprising alkyl, alkylene, or alkylidene;

and R4, R5, and R6 are each independently selected from alkoxyl, hydroxyl, halide, OC(O)R, or OC(O)OR, wherein R is alkyl or a substituted alkyl;

c) a Compound F3 selected from Formula 3:

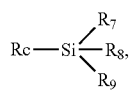

(Formula 3)

wherein Rc comprises more than one multiple bond, and these multiple bonds are in a conjugated configuration; and R7, R8, and R9 are each independently selected from alkoxyl, hydroxyl, halide, OC(O)R, or OC(O)OR, wherein R is alkyl or a substituted alkyl; and d) a Compound F4 selected from Formula 4:

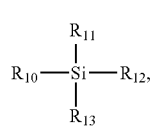

(Formula 4)

wherein R10, R11, R12, and R13 are each independently selected from alkoxyl, hydroxyl, halide, OC(O)R, or OC(O)OR, wherein R is alkyl or a substituted alkyl; and wherein the molar ratio of F1/F4 is from 1/20 to 1/1; and wherein Compound F4 is present in an amount from 10 to 60 mole percent, based on the sum moles of Compounds F1, F2, F3 and F4.

2. The composition of claim 1, wherein the first composition comprises less than 2 weight percent of a trivalent or higher multivalent alcohol, based on the weight of the prepolymer.

3. The composition of claim 1, wherein in Formula A, at least two of R1', R2', R3' or R4' are each a methyl.

4. The composition of claim 1, wherein R1', R2', R3', R4' are each independently selected from hydrogen, C1-C3 alkyl or aryl.

5. The composition of claim 1, wherein the composition comprises less than 1 ppm of a metal oxide, based on the weight of the composition.

6. The composition of claim 1, wherein the composition comprises less than 1 ppm of a "light absorbing dye," based on the weight of the composition.

7. A crosslinked composition formed from the composition of claim 1.

8. An article comprising at least one component formed from the composition of claim 1.

9. A film comprising at least one layer formed from the composition of claim 1.

10. The film of claim 9, further comprising a second layer formed from a third composition comprising a polymer.

11. A method of forming a coating on a substrate, said method comprising at least the following: providing a substrate, forming an underlayer on the substrate, wherein the underlayer comprises at least one polymer, applying the composition of claim 1 over the underlayer, and curing the composition to form the coating.

12. The method of claim 11, wherein multiple layers of the composition are applied over the underlayer.

13. The method of claim 11, wherein the coating is an antireflective layer.

14. A method of forming a coating on a substrate, said method comprising at least the following: providing a substrate, applying the composition of claim 1 over at least a portion of the substrate, or over one or more intermediate layers applied over said substrate, and curing the composition to form the coating.

15. The method according to claim 14, wherein multiple layers of the composition are applied over at least a portion of the substrate, or over one or more intermediate layers applied over said substrate.

16. The composition of claim 1, wherein the sum molar amount of Compound 2 and Compound 4 is less than, or equal to, 85 mole percent, based on the sum moles of Compounds F1, F2, F3 and F4.

17. The composition of claim 1, wherein the sum molar amount of Compound 2 and Compound 4 is greater than, or equal to, 40 mole percent, based on the sum moles of Compounds F1, F2, F3 and F4.

18. The composition of claim 1, wherein Compound F1 is present in an amount from 5 to 50 weight percent; Compound F2 is present in an amount from 5 to 50 weight percent; Compound F3 is present in an amount from 2 to 20 weight percent; and Compound F4 is present in an amount from 20 to 80 weight percent; and wherein each weight percentage is based on the weight of the first composition.

19. A composition comprising at least the following:

A) a cure catalyst selected from Formula A:

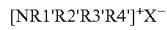  (Formula A),

R1', R2', R3', R4' are each independently selected from hydrogen, alkyl (linear or branched), substituted alkyl, aryl, or substituted aryl;

X is a monovalent anion, and wherein in Formula A, at least one of R1', R2', R3' or R4' is a methyl; and B) a prepolymer formed from a first composition comprising the following:

a) a Compound F1 selected from Formula 1:

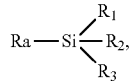  (Formula 1)

wherein Ra comprises one or more multiple bonds, provided that, if Ra comprises more than one multiple bond, these multiple bonds are not in a conjugated configuration; and R1, R2, and R3 are each independently selected from alkoxyl, hydroxyl, halide, OC(O)R, or OC(O)OR, wherein R is alkyl or a substituted alkyl;

b) a Compound F2 selected from Formula 2:

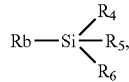  (Formula 2)

wherein Rb is selected from H or a saturated group comprising alkyl, alkylene, or alkylidene;

and R4, R5, and R6 are each independently selected from alkoxyl, hydroxyl, halide, OC(O)R, or OC(O)OR, wherein R is alkyl or a substituted alkyl;

c) a Compound F3 selected from Formula 3:

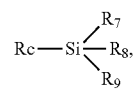  (Formula 3)

wherein Rc comprises more than one multiple bond, and these multiple bonds are in a conjugated configuration; and R7, R8, and R9 are each independently selected from alkoxyl, hydroxyl, halide, OC(O)R, or OC(O)OR, wherein R is alkyl or a substituted alkyl; and d) a Compound F4 selected from Formula 4:

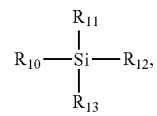  (Formula 4)

wherein R10, R11, R12, and R13 are each independently selected from alkoxyl, hydroxyl, halide, OC(O)R, or OC(O)OR, wherein R is alkyl or a substituted alkyl; and wherein the molar ratio of F1/F4 is from 1/20 to 1/1; and wherein Compound F1 is present in an amount from 5 to 50 weight percent; Compound F2 is present in an amount from 5 to 50 weight percent; Compound F3 is present in an amount from 2 to 20 weight percent; and Compound F4 is present in an amount from 20 to 80 weight percent; and wherein each weight percentage is based on the weight of the first composition.

* * * * *